(12) United States Patent
Hashimoto et al.

(10) Patent No.: US 12,022,637 B2
(45) Date of Patent: Jun. 25, 2024

(54) ELECTRONIC EQUIPMENT AND LIGHT TRANSMISSION DEVICE WITH COLD PLATE FOR COOLING

(71) Applicant: FUJITSU LIMITED, Kawasaki (JP)

(72) Inventors: Tsubasa Hashimoto, Kita (JP); Kazuhiro Iino, Yokohama (JP); Kouichi Kuramitsu, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 194 days.

(21) Appl. No.: 17/667,702

(22) Filed: Feb. 9, 2022

(65) Prior Publication Data
US 2022/0369506 A1 Nov. 17, 2022

(30) Foreign Application Priority Data
May 12, 2021 (JP) .................................. 2021-081167

(51) Int. Cl.
*H05K 7/20* (2006.01)
*G02B 6/42* (2006.01)
*H04B 1/036* (2006.01)
*H04B 10/50* (2013.01)

(52) U.S. Cl.
CPC ....... *H05K 7/20254* (2013.01); *G02B 6/4268* (2013.01); *H04B 1/036* (2013.01); *H04B 10/501* (2013.01)

(58) Field of Classification Search
CPC ........... H05K 7/20254; H05K 7/20636; G02B 4/4266–4273; H01R 13/6581; H01R 24/28; H01R 24/64; H01R 25/006; H01R 2107/00; H04B 1/036; H04B 10/501
See application file for complete search history.

(56) References Cited

U.S. PATENT DOCUMENTS

| | | | |
|---|---|---|---|
| 9,910,231 B2 * | 3/2018 | Kelty | G02B 6/4269 |
| 10,765,038 B1 * | 9/2020 | Leigh | H05K 7/20772 |
| 11,729,941 B2 * | 8/2023 | Yang | H05K 9/0058 |
| | | | 439/199 |
| 2015/0077937 A1 * | 3/2015 | Daly | G02B 6/4268 |
| | | | 361/699 |
| 2020/0137922 A1 | 4/2020 | Iino et al. | |
| 2020/0153163 A1 * | 5/2020 | Guetig | G02B 6/4277 |
| 2021/0132311 A1 * | 5/2021 | Shearman | G02B 6/4261 |
| 2022/0252800 A1 * | 8/2022 | Myhre | H05K 7/20454 |

FOREIGN PATENT DOCUMENTS

| | | |
|---|---|---|
| JP | 2002-280782 A | 9/2002 |
| JP | 2006-351585 A | 12/2006 |
| JP | 2020-72133 A | 5/2020 |

\* cited by examiner

*Primary Examiner* — Zachary Pape
(74) *Attorney, Agent, or Firm* — WHDA, LLP

(57) ABSTRACT

An electronic equipment includes: a housing; a cold plate fixed to the housing, a cooling liquid flowing at an interior of the cold plate; a cage that is supported at the housing so as to be movable toward and away from the cold plate, an object of cooling being inserted into the cage; and an elastic member that pushes the cage toward a cold plate side, wherein the cold plate has a contact that is provided at a position of contacting the object of cooling in a state in which the object of cooling is inserted in the cage.

13 Claims, 10 Drawing Sheets

ELECTRONIC EQUIPMENT AND LIGHT TRANSMISSION DEVICE WITH COLD PLATE FOR COOLING

CROSS-REFERENCE TO RELATED APPLICATION

This application is based upon and claims the benefit of priority of the prior Japanese Patent Application No. 2021-081167, filed on May 12, 2021, the entire contents of which are incorporated herein by reference.

FIELD

The embodiments discussed herein are related to an electronic equipment and a light transmission device.

BACKGROUND

As placement devices with a rack for the placement of equipment having heat generating portions, there are structures having an interior housing in which equipment are placed and that is provided within an exterior housing, which is fixed to a rack, such that the interior housing can be inserted into and removed from the exterior housing from a front surface side of the rack. In this placement device with a rack, a heat discharging means for absorbing the heat generated by the heat generating portions is provided at the exterior housing. Heat transferring means, which sets the interior housing and the exterior housing in close contact with one another thermally and causes the heat discharging means to absorb the heat of the heat generating portions, is provided between the exterior housing and the interior housing.

At an electronic equipment in which an object of cooling contacts a cage of the housing, there are cases in which a liquid cooling structure, through whose interior cooling liquid flows, is used as a cooling member such as a cold plate or the like that contacts an object of cooling and receives the heat of the object of cooling.

RELATED PATENT DOCUMENTS

Japanese Patent Application Laid-Open (JP-A) No. 2006-351585

SUMMARY

According to an aspect of the embodiments, there is provided an electronic equipment including: a housing; a cold plate fixed to the housing, a cooling liquid flowing at an interior of the cold plate: a cage that is supported at the housing so as to be movable toward and away from the cold plate, an object of cooling being inserted into the cage; and an elastic member that pushes the cage toward a cold plate side, wherein the cold plate has a contact that is provided at a position of contacting the object of cooling in a state in which the object of cooling is inserted in the cage.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

An embodiment of the technique disclosed in the present application is described hereinafter.

Figure 1:
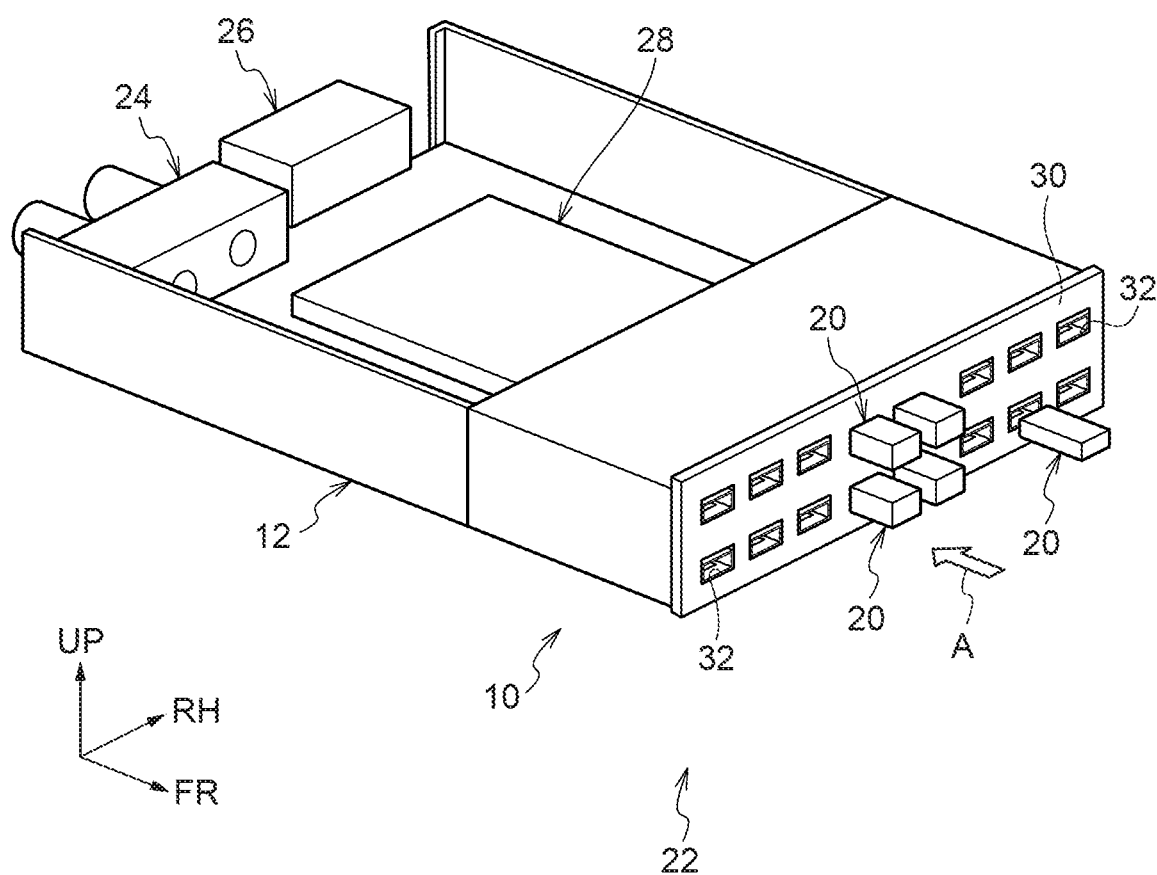
FIG. 1 is a perspective view of an electronic equipment relating to an embodiment of the technique disclosed in the present application.
Figure 2:
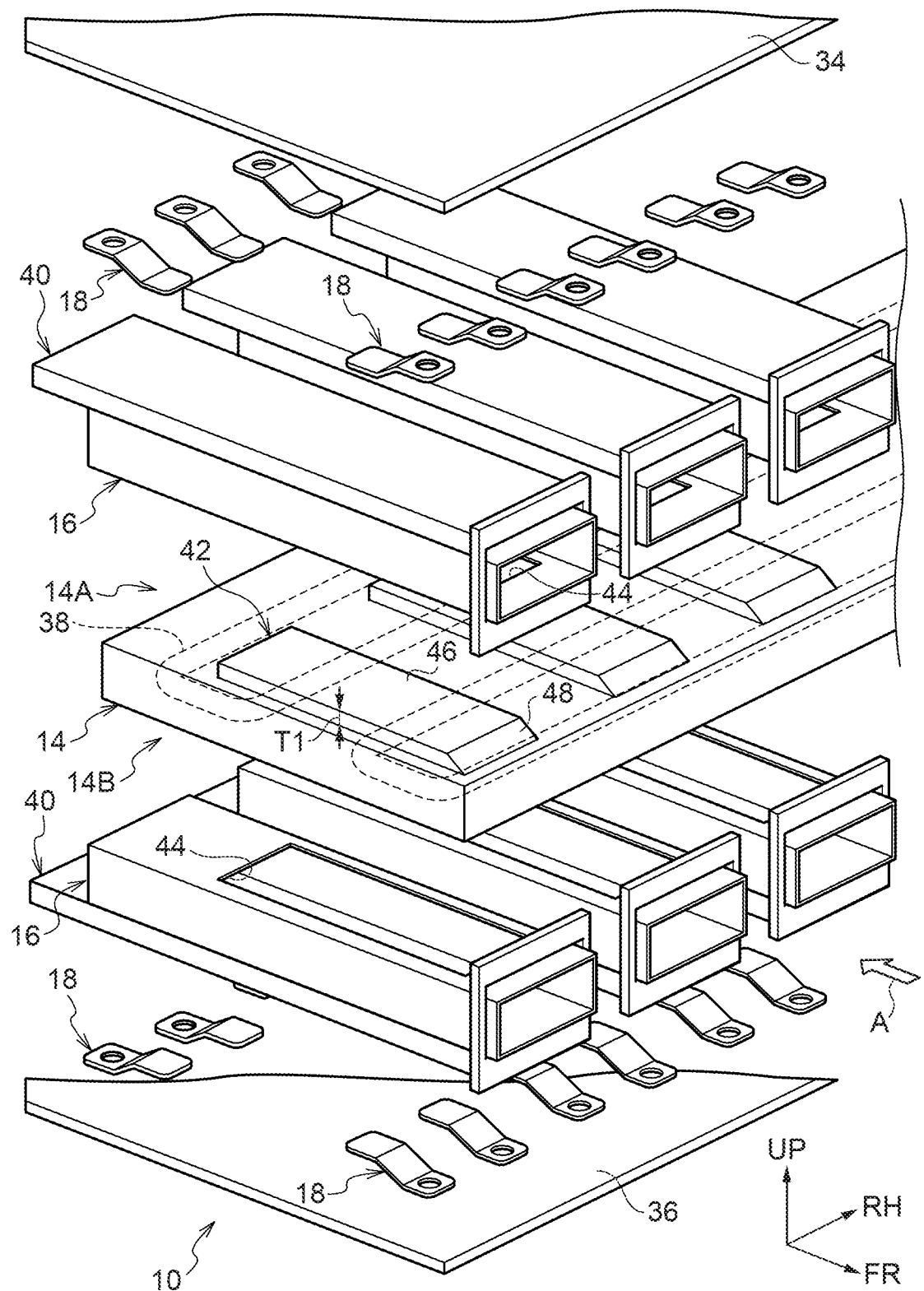
FIG. 2 is an exploded perspective view that partially illustrates the electronic equipment depicted in FIG. 1.

An electronic equipment 10 relating to an embodiment of the technique disclosed in the present application is illustrated in FIG. 1 and FIG. 2. Arrow FR denotes the longitudinal direction front side of the electronic equipment 10, arrow RH denotes the left-right direction right side of the electronic equipment 10, and arrow UP denotes the vertical direction upper side of the electronic equipment 10, respectively.

As depicted in FIG. 1, the electronic equipment 10 relating to the present embodiment has a housing 12. Further, as illustrated in FIG. 2, the electronic equipment 10 has a cold plate 14, cages 16, and plate springs 18. As illustrated in FIG. 1, plural light transmission modules 20 are connected to the electronic equipment 10. The electronic equipment 10 and the light transmission modules 20 form a light transmission device 22. The electronic equipment 10 can, for example, convert optical signals transmitted from the light transmission modules 20 into electric signals and output the electric signals to external devices, and can convert electric signals from the exterior into optical signals and send the optical signals to external devices by the light transmission modules 20.

As illustrated in FIG. 1, the housing 12 is formed in the shape of a flat plate. Connectors 24, 26 for connecting the electronic equipment 10 to other equipment and the like are provided at the back surface side of the housing 12. Any of various types of electronic parts 28 are placed in the interior of the housing 12.

Connection ports 32 are formed in a front wall 30 of the housing 12. The connection ports 32 correspond to the light transmission modules 20 that are connected. In the example depicted in FIG. 1, there are two rows of the connection ports 32 in the vertical direction of the electronic equipment 10, and eight of the connection ports 32 are formed in the left-right direction in each row. Accordingly, the housing 12 has a total of 16 of the connection ports 32.

Figure 4:
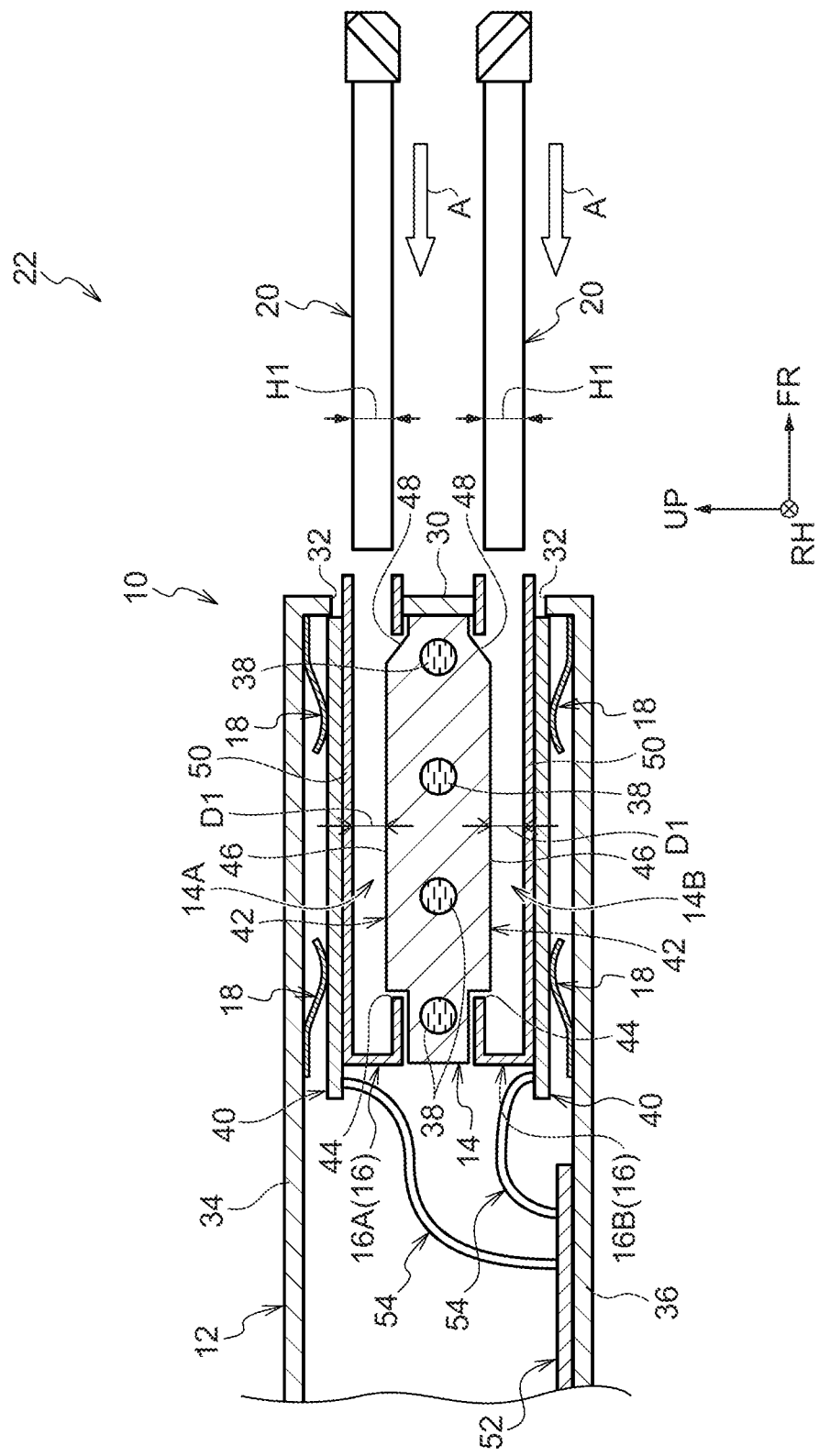
FIG. 4 is a side sectional view illustrating the electronic equipment depicted in FIG. 1, in a state before insertion of a light transmission module.

As depicted in FIG. 4 as well, the cold plate 14 is disposed in the interior of the housing 12. The cold plate 14 is a flat-plate-shaped member formed from a metal having high thermal conductivity, such as copper or the like. The cold plate 14 is at a position between the connection ports 32 that are at the upper side and the connection ports 32 that are at the lower side. The cold plate 14 is fixed to the housing 12 by using unillustrated fixing implements such as brackets, bolts or the like. The length direction of the cold plate 14 coincides with the left-right direction of the electronic equipment 10. The short-side direction of the cold plate 14 coincides with the longitudinal direction of the electronic equipment 10. The thickness direction of the cold plate 14 coincides with the vertical direction of the electronic equipment 10.

Figure 3:
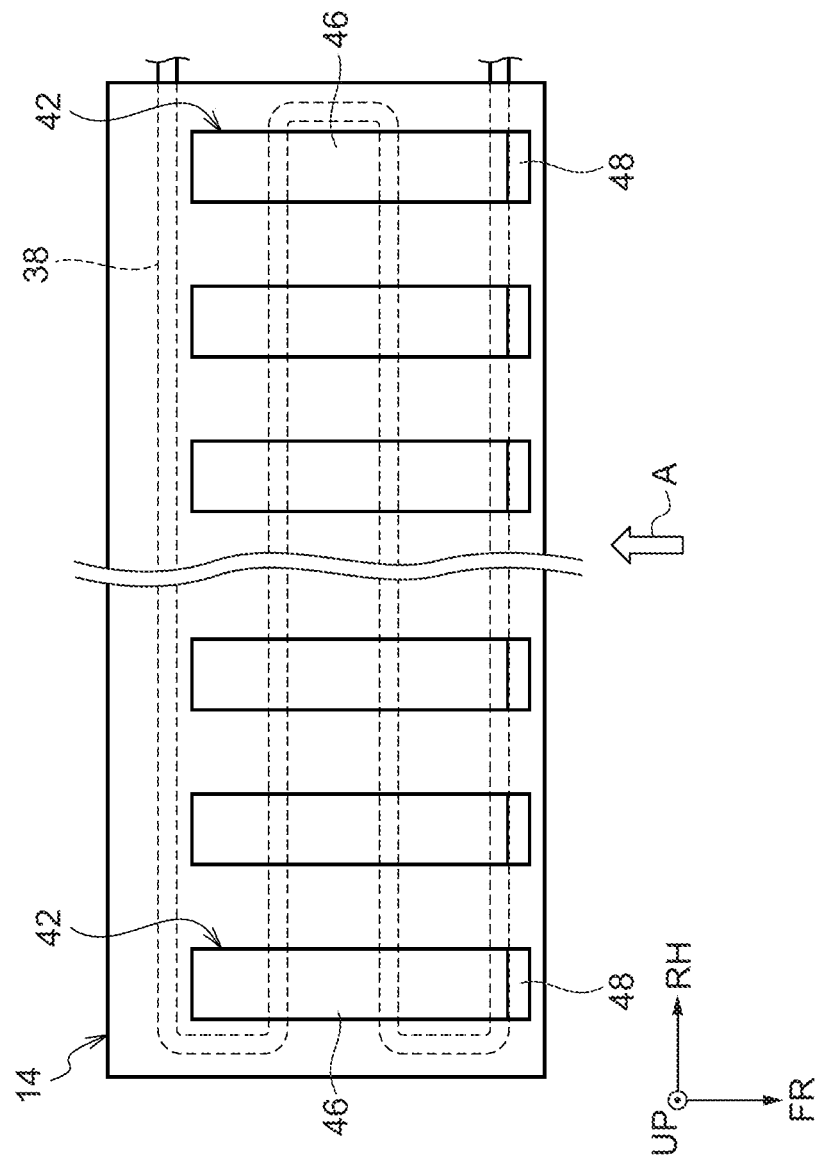
FIG. 3 is a plan view illustrating a cold plate of the electronic equipment depicted in FIG. 2.

A cooling liquid flow path 38 through which cooling liquid flows is provided at the interior of the cold plate 14. As depicted in FIG. 3, the cooling liquid flow path 38 is formed so as to meander in a direction orthogonal to the direction (the arrow A direction) of inserting the light transmission modules 20 into the cages 16. The cooling liquid flow path 38 is, for example, a pipe. The cooling liquid flow path 38 can transmit the heat of the cold plate 14 to the cooling liquid that flows through the cooling liquid flow path 38. The cooling liquid flow path 38 may be a space portion that is formed in the cold plate 14.

As illustrated in FIG. 2 and FIG. 4, the top surface of the cold plate 14 is a first surface 14A. The bottom surface of the cold plate 14, i.e., the surface opposite the first surface 14A, is a second surface 14B.

The plural cages 16 are provided at the first surface 14A and the second surface 14B of the cold plate 14. The cages 16 respectively correspond to the light transmission modules 20 that are connected to the electronic equipment 10. The cages that are disposed at the first surface 14A are first cages 16A. The cages 16 that are disposed at the second surface 14B are second cages 16B. The plural cages 16 are disposed so as to be lined-up in the left-right direction of the electronic equipment 10. The one cold plate 14 is used in common by the plural cages 16.

The cages 16 are rectangular parallelepiped, box-shaped members. The cages 16 are disposed so as to be oriented such that the longitudinal direction of the electronic equipment 10 coincides with the length directions of the cages 16. The front sides, in the longitudinal direction of the electronic equipment 10, of the cages 16 are open. The light transmission modules 20 can be inserted into and removed from the cages 16. The light transmission modules 20 are maintained in inserted states by being anchored by unillustrated stoppers in states in which the light transmission modules 20 are inserted in the cages 16. Further, the light transmission modules 20 can be pulled-out from the cages 16 due to the anchoring by the stoppers being released.

Movable substrates 40 are fixed to the top surfaces of the first cages 16A. Similarly, movable substrates 40 are fixed also to the bottom surfaces of the second cages 16B.

The plate springs 18 are disposed between the movable substrates 40 that are at the upper side and a ceiling plate 34. The plate springs 18 are examples of the elastic members. The plate springs 18 are also disposed between the movable substrates 40 at the lower side and a bottom plate 36.

At each of the plate springs 18 that are between the upper side movable substrates 40 and the ceiling plate 34, one end portion contacts the ceiling plate 34, and the other end portion contacts the movable substrate 40. Due thereto, the movable substrates 40 at the upper side and the first cages 16A are supported at the housing 12 so as to be able to approach and move away from the cold plate 14. When the first cage 16A moves in the direction of moving away from the cold plate 14 (in the upward direction), the spring forces of the plate springs 18 are applied to the first cage 16A via the movable substrate 40. Due thereto, the plate springs 18 push the first cage 16A in a downward direction, i.e., toward the cold plate 14 side.

Similarly, at each of the plate springs 18 that are between the lower side movable substrates 40 and the bottom plate 36, one end portion contacts the bottom plate 36, and the other end portion contacts the movable substrate 40. Due thereto, the movable substrates 40 at the lower side and the second cages 16B are supported at the housing 12 so as to be able to approach and move away from the cold plate 14. When the second cage 16B moves in the direction of moving away from the cold plate 14 (in the downward direction), the spring forces of the plate springs 18 are applied to the second cage 16B via the movable substrate 40. Due thereto, the plate springs 18 push the second cage 16B in an upward direction, i.e., toward the cold plate 14 side.

As depicted in FIG. 2, in the present embodiment, a total of four of the plate springs 18 are used with respect to one of the cages 16, in two rows in each of the left-right direction and the longitudinal direction of the electronic equipment 10.

Projecting portions 42 are formed at the first surface 14A and the second surface 14B of the cold plate 14. The projecting portions 42 correspond to the cages 16, respectively. The projecting portions 42 are formed in shapes such as convex shapes, step shapes or the like, and project-out toward the cages 16. Openings 44 are formed in the cages 16. The openings 44 are formed at positions corresponding to the projecting portions 42. Respective peak surfaces 46 of the projecting portions 42 are planar, and are examples of the contacting surfaces. As will be described later, the projecting portions 42 are provided at positions that are contacted by the light transmission modules 20, in states in which the light transmission modules 20 are inserted in the cages 16. The projecting portions 42 are the contacts.

Inclined surfaces 48 are formed at the projecting portions 42. The inclined surface 48 is formed further toward the longitudinal direction front side of the electronic equipment 10 than the peak surface 46, i.e., at the entrance side of the light transmission module 20 into the cage 16. The inclined surface 48 is a surface that is inclined toward the corresponding plate spring 18 side while heading toward the deep side of the cage 16, i.e., toward the longitudinal direction rear side of the electronic equipment 10.

As depicted in FIG. 4, in the state in which the light transmission module 20 is not inserted in the cage 16, the cage 16 is pushed by the plate springs 18 and moves toward the cold plate 14 side. In this state, a portion of the peak surface 46 side of the projecting portion 42 is positioned within the cage 16. Further, when the electronic equipment 10 is viewed in the arrow A direction from the entrance side, a portion of the inclined surface 48, and specifically, the portion that is near the peak surface 46, can be seen.

At the cage 16, the portion that faces the corresponding projecting portion 42 is a facing portion 50. As depicted in FIG. 4, in the state in which the light transmission module 20 is not inserted in the cage 16, the cage 16 that is pushed by the plate springs 18 is at a position of having moved toward the cold plate 14 side. Interval dimension D1 between the facing portion 50 and the peak surface 46 (contacting surface) of the projecting portion 42 in this state is set to be shorter than height dimension H1 of the light transmission module 20.

Figure 8:
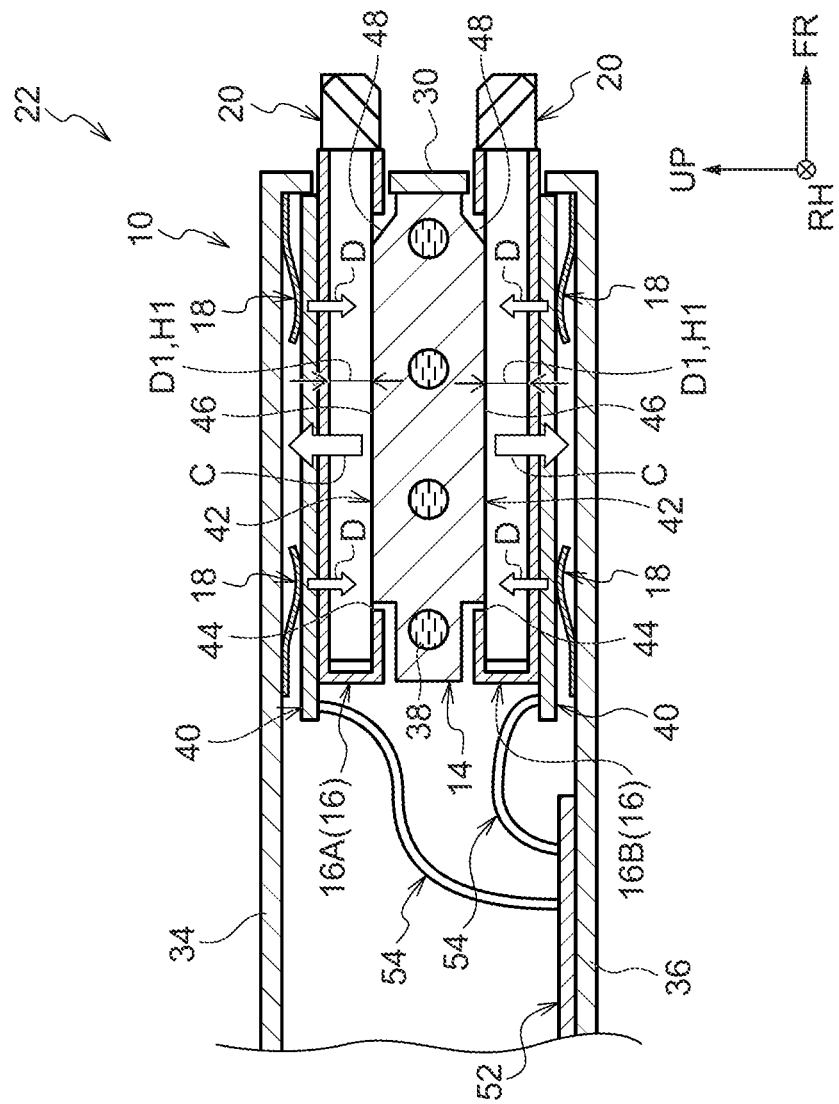
FIG. 8 is a side sectional view illustrating the electronic equipment depicted in FIG. 1, in a state after insertion of the light transmission module.
Figure 9:
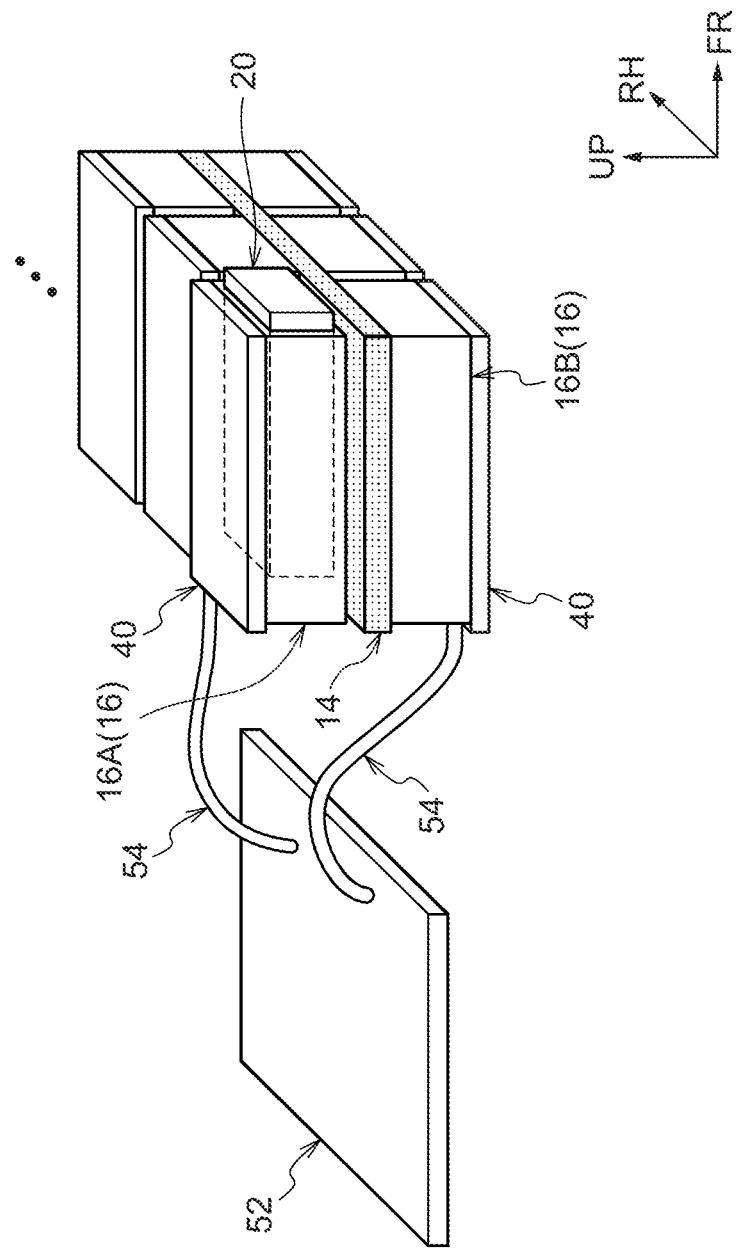
FIG. 9 is a perspective view partially illustrating the electronic equipment depicted in FIG. 1, in the state after insertion of the light transmission module.

As illustrated in FIG. 8, in the state in which the light transmission module 20 is inserted in the cage 16, the cage 16 moves in the direction of moving away from the cold plate 14, and is pushed toward the cold plate 14 side by the plate springs 18. In this state, the interval dimension D1 coincides with the height dimension H1 of the cage 16, and the light transmission module 20 contacts the peak surface 46 of the projecting portion 42. Projecting dimension T1 (refer to FIG. 2) of the projecting portion 42 is set such that the light transmission module 20 reliably contacts the cold plate 14 in the state in which the light transmission module 20 is inserted in the cage 16 in this way.

Note that, in the example that is depicted in FIG. 4, the cooling liquid flow path 38 is not formed in the projecting portion 42 at the cold plate 14. However, the cooling liquid flow path 38 may be formed in the projecting portion 42.

Figure 5:
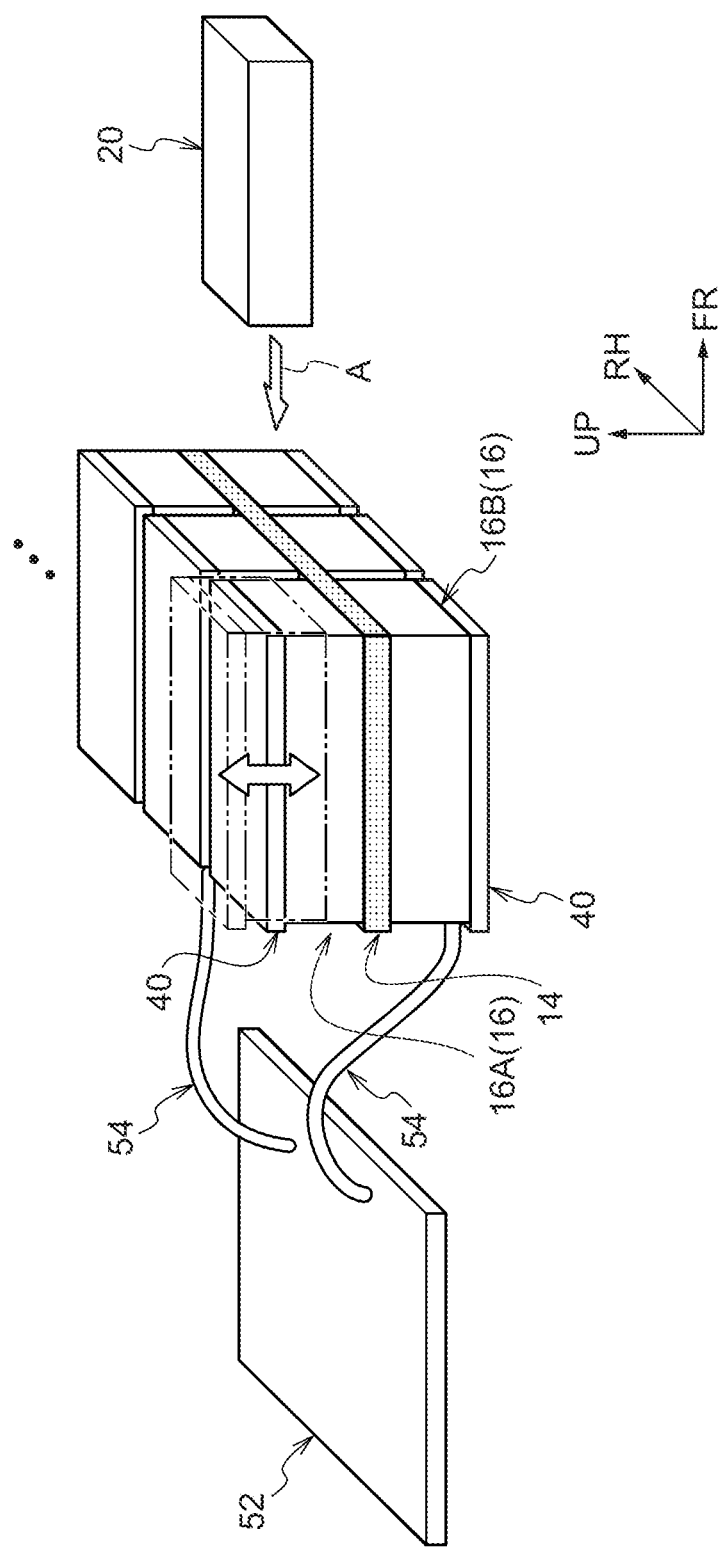
FIG. 5 is a perspective view partially illustrating the electronic equipment depicted in FIG. 1, in the state before insertion of the light transmission module.

As illustrated in FIG. 4 and FIG. 5, a fixed substrate 52 is provided at the interior of the housing 12. The fixed substrate 52 is fixed to the bottom plate 36 of the housing 12. The fixed substrate 52 and the movable substrates 40 are electrically connected by connection cables 54 that are flexible.

Operation and effects of the present embodiment are described next.

At the electronic equipment 10 relating to the present embodiment, as illustrated in FIG. 4, in the state in which the light transmission module 20 is not inserted in the cage 16, the cage 16 is pushed by the plate springs 18 and is at a position near the cold plate 14. Refer also to the cages 16 illustrated by the solid lines in FIG. 5. In this state, a portion, which includes the peak surface 46, of the projecting portion 42 projects-out from the opening 44 into the cage 16 interior. The inclined surface 48 of the projecting portion 42 is at a position at which it can be seen from the entrance side of the cage 16, and is inclined toward the side of the corresponding plate springs 18 while heading toward the deep side.

Figure 6:
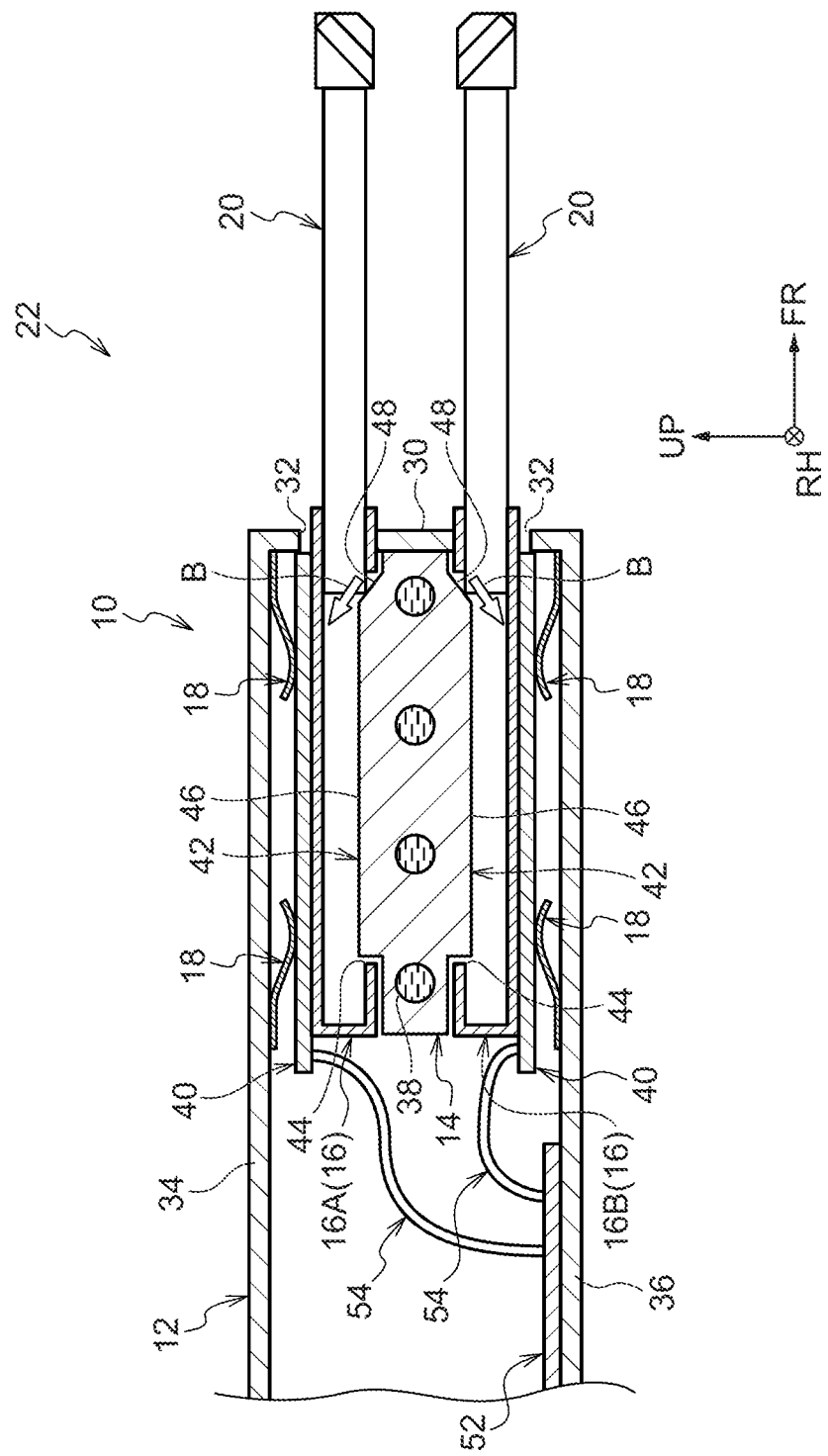
FIG. 6 is a side sectional view illustrating the electronic equipment depicted in FIG. 1, in a state in the midst of insertion of the light transmission module.
Figure 7:
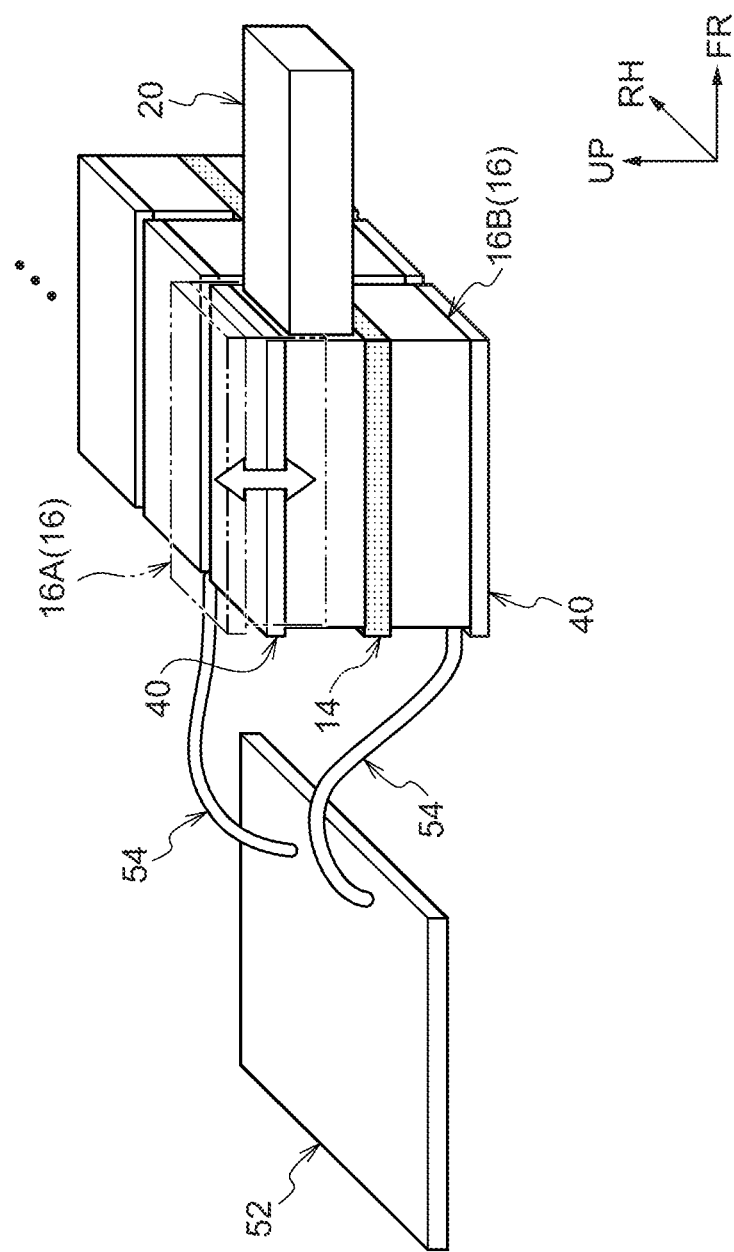
FIG. 7 is a perspective view partially illustrating the electronic equipment depicted in FIG. 1, in the state in the midst of insertion of the light transmission module.

When, in this state, the light transmission module 20 is inserted in the cage 16, in the midst of the insertion, the leading end of the light transmission module 20 abuts the inclined surface 48 as depicted in FIG. 6. Because the inclined surfaces 48 is inclined toward the side of the plate springs 18 while heading toward the deep side, the light transmission module 20 also moves toward the side of the plate springs 18 while moving toward the deep side, as depicted by arrow B in FIG. 6. Refer also the cage 16 that is illustrated by the two-dot chain line in FIG. 7. Then, when the light transmission module 20 goes past the inclined surface 48, the light transmission module 20 moves further toward the deep side along the peak surface 46.

Then, as depicted in FIG. 8, there becomes a state in which the light transmission module 20 is inserted up to a predetermined position within the cage 16. In this state, the light transmission module 20 contacts the projecting portion 42, and, as depicted by arrow C in FIG. 8, the moves in a direction of moving away from the cold plate 14. Due thereto, the spring forces from the plate springs 18 act on the cage 16 as depicted by arrows D. The projecting portion 42 is formed at the cold plate 14, and the light transmission module 20, which is in the state of being inserted in the cage 16, is pushed against the projecting portion 42.

In this way, at the electronic equipment 10 relating to the present embodiment, in the state in which the light transmission module 20 is inserted in the cage 16, the cage 16 is pushed toward the cold plate 14 side by the spring forces of the plate springs 18. Due thereto, the light transmission module 20 is made to contact the cold plate 14. Note that, in order to make the light transmission module 20 contact the cold plate 14, for example, a structure that is provided with an operation member also may be employed. Namely, there may be a structure that is provided with a converting mechanism or the like that converts the rotational operation of this operation member into the operation of causing the cage 16 to approach the cold plate 14. However, providing such a converting mechanism or the like leads to complication of the structure. In contrast, in the electronic equipment 10 relating to the present embodiment, there is no need for such a converting mechanism in order to make the light transmission module 20, which is inserted in the cage 16, contact the cold plate 14. Namely, in the electronic equipment 10 relating to the present embodiment, the light transmission modules 20 can be made to contact the cold plate 14 and can be cooled by a simple structure.

Figure 10:
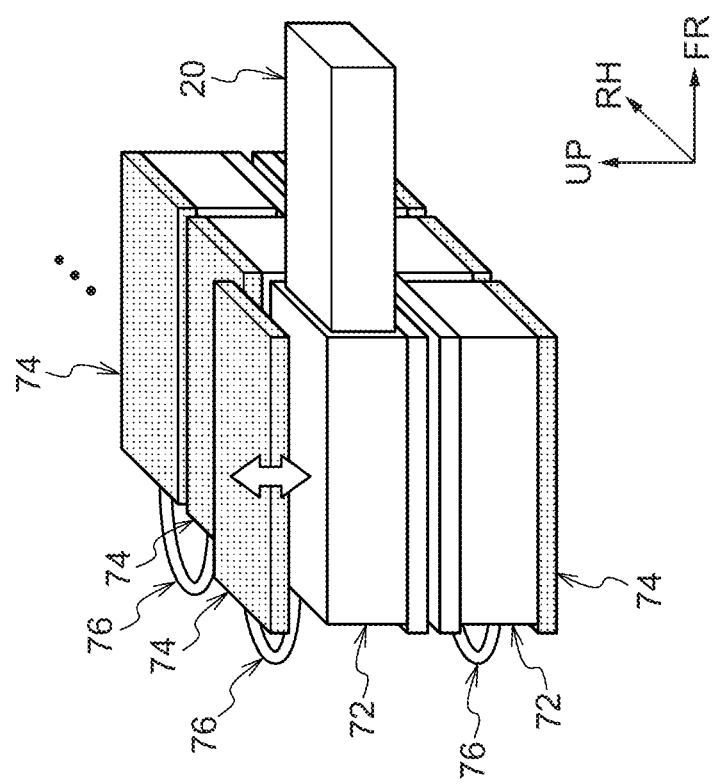
FIG. 10 is a perspective view partially illustrating an electronic equipment of a comparative example, in a state in the midst of insertion of the light transmission module.

Further, in the electronic equipment 10 relating to the present embodiment, there is a so-called liquid cooling structure. Namely, because the cooling liquid flows at the interior of the cold plate 14, the heat of the cold plate 14 is moved to the cooling liquid, and cooling of the light transmission modules 20 can thereby be devised. Further, simplification of the liquid cooling structure can be devised by fixing the cold plate 14 to the housing. This point will be described in comparison with an electronic equipment 70 of a comparative example that is depicted in FIG. 10.

In the electronic equipment 70 relating to the comparative example, cages 72 are fixed to a housing (not illustrated in FIG. 10), and cold plates 74 are mounted to the housing so as to be able to approach and move away from the cages 72 as illustrated by arrow F. Further, this is a structure in which, in the state in which the light transmission module 20 is inserted in the cage 72, the cold plate 74 contacts the light transmission module 20 by approaching the cage 72.

In the electronic equipment 70 relating to the comparative example, the cold plates 74 can move with respect to the housing. Therefore, suppression of liquid leakage at the portions, which are connected to the cold plates 74, of the supply pipes that supply the cooling liquid to the cold plates 74 is required. Further, in the electronic equipment 70 relating to the comparative example, the cold plates 74 are divided per cage 72. Therefore, pipes 76, which are connected to the cold plates 74 and through which the cooling liquid flows, are provided in order to supply the cooling liquid to the plural cold plates 74. Providing the pipes 76 leads to complication of the structure at the electronic equipment 70 relating to the comparative example. Moreover, at the electronic equipment 70 relating to the comparative example, the suppression of leaking of liquid from the connected portions of the pipes 76 and the cold plates 74 and the like also is required.

Moreover, in the electronic equipment 70 relating to the comparative example, the cooling liquid flows through the plural cold plates 74 in order. Therefore, cooling liquid, which is in a state in which the temperature thereof has risen, flows into the cold plates 74 that are positioned at the downstream side in the flowing direction of the cooling liquid. Namely, at the electronic equipment 70 relating to the comparative example, deviation arises in the effect of cooling the plural light transmission modules 20, and it is difficult to devise uniformity of the cooling effect.

In contrast, in the electronic equipment 10 relating to the present embodiment, the cold plate 14 is fixed to the housing 12, and is used in common by the plural cages 16. Because the plural cold plates 14 are not connected by pipes, simplification of the structure can be devised. Further, because the cold plate 14 is fixed, it suffices to not employ a structure that suppresses leaking of liquid from portions that are connected to pipes.

Moreover, in the electronic equipment 10 relating to the present embodiment, as depicted in FIG. 3, the cooling liquid flow path 38 at the cold plate 14 is formed so as to meander with respect to the insertion direction (the arrow A direction) of the light transmission modules 20. Further, this is a structure in which, as seen in a plan view of the cold plate 14, the flow of the cooling liquid, which crosses over from the right side to the left side in the left-right direction of the electronic equipment 10, and the flow of the cooling liquid, which crosses over from the left side to the right side, are generated alternately with respect to the plural cages 16. Therefore, deterioration of the effect of cooling a specific light transmission module 20 can be suppressed. Namely, in the electronic equipment 10 relating to the present embodiment, deviation of the effect of cooling the plural light transmission modules 20 is suppressed, and uniformity of the cooling effect can be devised.

Further, in the electronic equipment 10 relating to the present embodiment, the cooling liquid flows through the cold plate 14, and the light transmission modules 20 are cooled by liquid cooling. In a case in which air cooling is carried out instead of this cooling by liquid, there are cases in which fins or the like are provided in order to broaden the surface area over which heat is transferred to the cooling air, and this leads to an increase in the size of the structure. In contrast, in the electronic equipment 10 relating to the present embodiment, such fins are unnecessary, and decreasing the size of the structure can be devised.

A modified example of the present embodiment is described next.

In the above-described embodiment, there is a structure in which the projecting portions 42 have the inclined surfaces 48, but there may be a structure that does not have such inclined surfaces 48. Namely, even if the inclined surfaces 48 are not provided, it suffices to realize a structure that causes the light transmission module 20 to contact the cold plate 14 due to the plate springs 18 pushing the cage 16 toward the cold plate 14 side in the state in which the light transmission module 20 is inserted in the cage 16. For example, there may be a structure in which the cage 16 is locked by a locking member at a position apart from the cold plate 14 such that the interval dimension D1 (refer to FIG. 4) is larger than the height dimension H1 of the light transmission module 20. In this case, if it is made such that the locking is released in the state in which the cold plate 14 is inserted in the cage 16, a structure in which the plate springs 18 push the cage 16 toward the cold plate 14 side can be realized.

Further, although the above-described embodiment is structured such that the peak surface 46 of the projecting portion 42 is planar, the peak surface 46 may be a shape having projections and indentations, and not a planar shape. If the peak surface 46 is made to be planar, the surface area of contact can be ensured to be broad, as compared with a shape having projections and indentations.

Further, although the above-described embodiment is structured such that the cold plate 14 has the projecting portions 42 that serve as an example of the contacts, the contact does not have to be the projecting portions 42. For example, the entire top surface and the entire bottom surface of the cold plate 14 may be formed to be planar. In this case, it suffices for the openings 44 of the first cages 16A to be open in correspondence with the top surface and the bottom surface of the cold plate 14. Namely, due thereto, a structure in which the top surface or the bottom surface of the cold plate 14 is positioned at the interiors of the cages 16, i.e., a structure in which the light transmission modules 20 that are inserted in the cages 16 contact the cold plate 14, can be realized.

Further, in the above-described embodiment, a structure is exemplified in which the cages 16 are provided at both the first surface 14A and the second surface 14B of the cold plate 14, but there may be a structure in which the cages 16 are provided only at either one side. For example, in a structure in which the cages 16 are provided only at the first surface 14A of the cold plate 14, the height dimension of the electronic equipment 10 can be made to be small by an arrangement in which the cold plate 14 and the bottom plate 36 are near one another at the second surface 14B.

Further, the above-described embodiment is a structure in which the plural cages 16 are disposed so as to be lined-up in the length direction of the cold plate 14, i.e., along the left-right direction of the electronic equipment 10. However, there may be a structure in which one cage 16 is disposed in a direction running along the length direction of the cold plate 14. In a structure in which the plural cages 16 are disposed so as to be lined-up, it is possible to connect a larger number of the light transmission modules 20 to the electronic equipment 10. Further, in the above-described embodiment, because the cold plate 14 is provided so as to be shared by the plural cages 16, simplification of the structure can be devised as compared with an example in which the cold plates 14 are provided so as to correspond respectively to the plural cages 16.

Further, although the cold plate 14 that is shaped as a flat plate is used as an example of the cold plate in the above-described embodiment, the cold plate does not have to be flat-plate-shaped. For example, the cold plate may be a block-shaped member.

Further, the above-described embodiment is a structure in which the fixed substrate 52 and the movable substrates 40 are connected by the connection cables 54 that are flexible. Even if the movable substrates 40 move, by providing slack at the connection cables 54, changes in the relative positions with respect to the fixed substrate 52 can be absorbed by deformation of the connection cables 54. Instead of this, there may be a structure in which the fixed substrate 52 and the movable substrates 40 are connected by connection members that are not flexible, i.e., that do not deform substantially. In a case of using connection members that are not flexible, it suffices to employ a structure that can absorb the changes in the positions relative to the fixed substrate 52, within the range in which the movable substrates 40 can move.

Further, although the plate springs 18 are used as the elastic members in the above-described embodiment, a spring such as a disc spring or a coil spring or the like may be used instead of the plate spring 18. Moreover, a sponge or rubber or the like may be used as the elastic member. If the plate springs 18 are used, arranging is easy even if the space within the housing 12 is limited. The number of the plate springs 18 is not limited, and there may be one plate spring 18 per one cage 16. However, by pushing one cage by plural plate springs 18, the cage 16 can be pushed stably.

Further, the above-described embodiment is a structure in which the light transmission modules 20 that are objects of cooling can be inserted into and removed from the cages 16, and the light transmission device 22 is formed by the electronic equipment 10 and the light transmission modules 20. However, the object of cooling does not have to be the light transmission module 20. For example, there may be a structure in which plugs that transmit electric signals can be inserted into and removed from the cages 16.

Further, a state in which the housing 12 of the electronic equipment 10 is disposed horizontally is illustrated in the above-described embodiment. However, the housing 12 may be disposed vertically, i.e., may be disposed at an orientation that is such that the length direction of the front wall 30 is the vertical direction, as seen in the arrow A direction in FIG. 1.

Although an embodiment of the technique disclosed in the present application has been described above, the technique disclosed in the present application is not limited to the above, and, other than the above, can be implemented by being modified in various ways within a scope that does not depart from the gist thereof.

In an electronic equipment that cools an object of cooling by cooling by liquid, complication of the structure is brought about if, in order to make the object of cooling and the cold plate contact one another, for example, there is provided a converting mechanism that converts the rotational operation of an operation member into the motion of the cold plate approaching the object of cooling. Even in a light transmission device that has a light transmission module as the object of cooling, complication of the structure is brought about if such a converting mechanism is provided in order to move the light transmission module.

In contrast, in accordance with the technique disclosed in the present application, there can be provided an electronic equipment and a light transmission device that can cool an object of cooling by cooling by liquid, by a simple structure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions and alterations could be made hereto without departing from the spirit and scope of the invention.

All cited documents, patent applications and technical standards mentioned in the present specification are incorporated by reference in the present specification to the same extent as if the individual cited documents, patent applications and technical standards were specifically and individually incorporated by reference in the present specification.

What is claimed is:

1. An electronic equipment comprising:
a housing;
a cold plate fixed to the housing, a cooling liquid flowing at an interior of the cold plate;
a cage that is supported at the housing so as to be movable toward and away from the cold plate, an object of cooling being inserted into the cage; and
an elastic member that pushes the cage toward a cold plate side,
wherein the cold plate has a contact that is provided at a position of contacting the object of cooling in a state in which the object of cooling is inserted in the cage,
a first cage that serves as the cage and is provided at a first surface that intersects a thickness direction of the cold plate; and
a second cage that serves as the cage, and is provided at a second surface that is opposite the first surface and that intersects the thickness direction of the cold plate.

2. The electronic equipment of claim 1, wherein the contact projects out toward the cage.

3. The electronic equipment of claim 2, wherein the cage has an opening that opens at a position corresponding to the contact that projects out.

4. The electronic equipment of claim 3, wherein:
the contact that projects out has a contacting surface that contacts the object of cooling that is inserted in the cage,
the cage faces the contacting surface, and
an interval dimension between the contacting surface and the cage that faces the contacting surface is set to be smaller than a height dimension of the object of cooling in a state in which the object of cooling is not inserted in the cage.

5. The electronic equipment of claim 3, wherein a peak surface of the contact that projects out is planar.

6. The electronic equipment of claim 1, wherein a plurality of cages are disposed along the cold plate so as to be lined up in a direction intersecting a direction of insertion of the object of cooling into the housing.

7. The electronic equipment of claim 3, wherein the cold plate is used in common for the plurality of the cages.

8. The electronic equipment of claim 1, wherein:
the cold plate has a cooling liquid flow path within which the cooling liquid flows, and
the cooling liquid flow path meanders along the cold plate in a direction intersecting a direction of insertion of the object of cooling into the cage.

9. The electronic equipment of claim 1, comprising:
a fixed substrate that is fixed to the housing;
a movable substrate that is mounted to the cage; and
a connection cable that is flexible and electrically connects the fixed substrate and the movable substrate.

10. The electronic equipment of claim 1, wherein the object of cooling is a light transmission module.

11. An electronic equipment comprising:
a housing;
a cold plate fixed to the housing, a cooling liquid flowing at an interior of the cold plate;
a cage that is supported at the housing so as to be movable toward and away from the cold plate, an object of cooling being inserted into the cage; and
an elastic member that pushes the cage toward a cold plate side,
wherein the cold plate has a contact that is provided at a position of contacting the object of cooling in a state in which the object of cooling is inserted in the cage,
wherein the contact projects out toward the cage,
wherein the contact that projects out has an inclined surface that is provided at an entrance of the object of cooling into the cage, and that is inclined toward the elastic member while heading toward an interior of the cage.

12. A light transmission device comprising:
a housing;
a cold plate fixed to the housing, a cooling liquid flowing at an interior of the cold plate;
a cage that is supported at the housing so as to be movable toward and away from the cold plate;
an elastic member that pushes the cage toward the cold plate; and
a light transmission module inserted in the cage, wherein the cold plate has a contact that is provided at a position of contacting the light transmission module in a state in which the light transmission module is inserted in the cage, a first cage that serves as the cage and is provided at a first surface that intersects a thickness direction of the cold plate; and a second cage that serves as the cage, and is provided at a second surface that is opposite the first surface and that intersects the thickness direction of the cold plate.

13. A light transmission device comprising:

a housing;

a cold plate fixed to the housing, a cooling liquid flowing at an interior of the cold plate;

a cage that is supported at the housing so as to be movable toward and away from the cold plate;

an elastic member that pushes the cage toward the cold plate; and a light transmission module inserted in the cage, wherein the cold plate has a contact that is provided at a position of contacting the light transmission module in a state in which the light transmission module is inserted in the cage, wherein the contact projects out toward the cage, wherein the contact that projects out has an inclined surface that is provided at an entrance of the object of cooling into the cage, and that is inclined toward the elastic member while heading toward an interior of the cage.

* * * * *